(12) United States Patent
Gates et al.

(10) Patent No.: US 7,079,396 B2
(45) Date of Patent: Jul. 18, 2006

(54) MEMORY MODULE COOLING

(75) Inventors: William George Gates, Milton Keynes (GB); Richard John Harris, Farnborough (GB); Sean Conor Wrycraft, Harrow (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/867,422

(22) Filed: Jun. 14, 2004

(65) Prior Publication Data

US 2005/0276021 A1 Dec. 15, 2005

(51) Int. Cl.
*H05K 7/20* (2006.01)

(52) U.S. Cl. .................. 361/719; 361/704; 361/721; 361/715; 257/722; 174/16.3; 165/80.3

(58) Field of Classification Search .............. 361/704, 361/707, 715–721; 257/706, 712, 718, 719; 174/16.1, 16.3; 165/80.3, 185
See application file for complete search history.

(56) References Cited

U.S. PATENT DOCUMENTS

| | | | |
|---|---|---|---|
| 5,581,442 A | | 12/1996 | Morosas |
| 5,761,041 A | | 6/1998 | Hassanzadeh et al. |
| 5,966,287 A | * | 10/1999 | Lofland et al. ............ 361/704 |
| 6,025,992 A | * | 2/2000 | Dodge et al. ............. 361/704 |
| 6,031,727 A | * | 2/2000 | Duesman et al. .......... 361/761 |
| 6,119,765 A | * | 9/2000 | Lee ......................... 165/80.3 |
| 6,130,820 A | | 10/2000 | Konstad et al. |
| 6,201,695 B1 | * | 3/2001 | Duesman et al. .......... 361/703 |
| 6,319,756 B1 | * | 11/2001 | Duesman et al. .......... 438/122 |
| 6,424,532 B1 | | 7/2002 | Kawamura |
| 6,449,156 B1 | * | 9/2002 | Han et al. ................. 361/704 |
| 6,449,161 B1 | * | 9/2002 | Duesman et al. .......... 361/719 |
| 6,765,797 B1 | * | 7/2004 | Summers et al. .......... 361/704 |
| 6,775,139 B1 | * | 8/2004 | Hsueh ...................... 361/697 |
| 6,888,719 B1 | * | 5/2005 | Janzen et al. ............. 361/687 |
| 6,969,907 B1 | | 11/2005 | Imai et al. |
| 2005/0201063 A1 | * | 9/2005 | Lee et al. ................. 361/715 |

FOREIGN PATENT DOCUMENTS

DE    44 27 854 A1    2/1995
DE    203 15 169 U1   11/2003

OTHER PUBLICATIONS

Notification of Transmittal of the International Search Report and the Written Opinion of the International Searching Authority, or the Declaration, International application No. PCT/US2005/019964, Dec. 29, 2005.
International Search Report, International application No. PCT/US2005/019964, Dec. 29, 2005.
Written Opinion of the International Searching Authority, International application No. PCT/US2005/019964, Dec. 29, 2005.

* cited by examiner

*Primary Examiner*—Boris Chervinsky
(74) *Attorney, Agent, or Firm*—Meyertons Hood Kivlin Kowert & Goetzel, P.C.; B. Noël Kivlin

(57) ABSTRACT

A heatsink for a memory module includes a substantially planar contact portion for forming a thermal contact with the memory module and for mounting the heatsink on the memory module. One or more formations for emitting heat are also provided, the formations for emitting heat being in thermal communication with the contact portions.

37 Claims, 4 Drawing Sheets

MEMORY MODULE COOLING

BACKGROUND OF THE INVENTION

The present inventions relates to providing cooling for memory modules, for example, Double Data Rate (DDR) memory modules or Dual Inline Memory Modules (DIMM).

Solid state memory provided in computer systems requires cooling to avoid over heating and malfunction.

With the increase in the speed of solid state memory, the amount of heat produced by such solid state memory has increased correspondingly.

Furthermore, the physical density with which solid state memory is often provided in computer systems increasingly means that solid state memory components need to be placed closer together. This leads to a large amount of heat to being produced in a small area as well as hindering the dissipation of heat from that area.

The present invention aims to solve at least some of the problems indicated above.

SUMMARY OF THE INVENTION

Aspects of the invention are defined in the accompanying independent and dependent claims.

According to an aspect of the invention there is provided a heatsink for a memory module. The heatsink includes a substantially planar contact portion for forming a thermal contact with the memory module and for mounting the heatsink on the memory module. The heatsink also includes one or more formations for emitting heat, the formations for emitting heat being in thermal communication with the contact portions.

The heatsink can include a pair of mutually opposing contact portions. The mutually opposing contact portions can form a pair of jaws biased toward a closed position, for engaging with two opposite outer surfaces of the memory module for mounting the heatsink on the memory module. The heatsink can be dimensioned to occupy substantially a same width as a memory module on which it is mountable. This would allow a plurality of memory modules on which heatsinks such as those described above are mounted to be densely spaced in a computer system. The memory module can include Double Data Rate (DDR) memory.

According to another aspect of the invention there is provided an assembly comprising a memory module and a heatsink. The heatsink is mounted on the memory module. The heatsink includes a substantially planar contact portion forming a thermal contact with the memory module. The heatsink also includes one or more formations for emitting heat, the formations for emitting heat being in thermal communication with the contact portion.

The heatsink can be mounted on the memory module using a thermally conductive adhesive located between the contact portion and the memory module.

According to a further aspect of the invention there is provided apparatus comprising a circuit board and a memory module and heatsink assembly. The memory module is mounted on the circuit board. The heatsink is mounted on the memory module. The heatsink includes a substantially planar contact portion forming a thermal contact with the memory module. The heatsink also includes one or more formations for emitting heat. The formations for emitting heat are in thermal communication with the contact portion.

The heatsink can dimensioned to occupy substantially a same width as the memory module on which it is mounted, for reducing space occupied by the memory module and heatsink assembly on the circuit board. The apparatus can include a socket mounted on the circuit board for receiving a plurality of memory module and heatsink assemblies side-by-side.

According to another aspect of the invention there is provided a computer system comprising a circuit board and a memory module and heatsink assembly. The memory module is mounted on the circuit board. The heatsink is mounted on the memory module. The heatsink includes a substantially planar contact portion forming a thermal contact with the memory module. The heatsink also includes one or more formations for emitting heat. The formations for emitting heat are in thermal communication with the contact portion.

The formations for emitting heat can be biased to allow passage of a flow of cooling air over the heatsink in one direction. The computer system can include a fan positioned to direct a flow of cooling air over the formations for emitting heat in said one direction.

According to a further aspect of the invention there is provided a method for cooling a memory module. The method includes providing heatsink. The heatsink includes a substantially planar contact portion for forming a thermal contact with the memory module and for mounting the heatsink on the memory module. The heatsink also includes one or more formations for emitting heat, the formations for emitting heat being in thermal communication with the contact portions. The method also includes mounting the heatsink on the memory module.

BRIEF DESCRIPTION OF THE DRAWINGS

Embodiments of the present invention will be described hereinafter by way of example only, with reference to the accompanying drawings in which like reference signs relate to like elements and in which.

Figure 1:
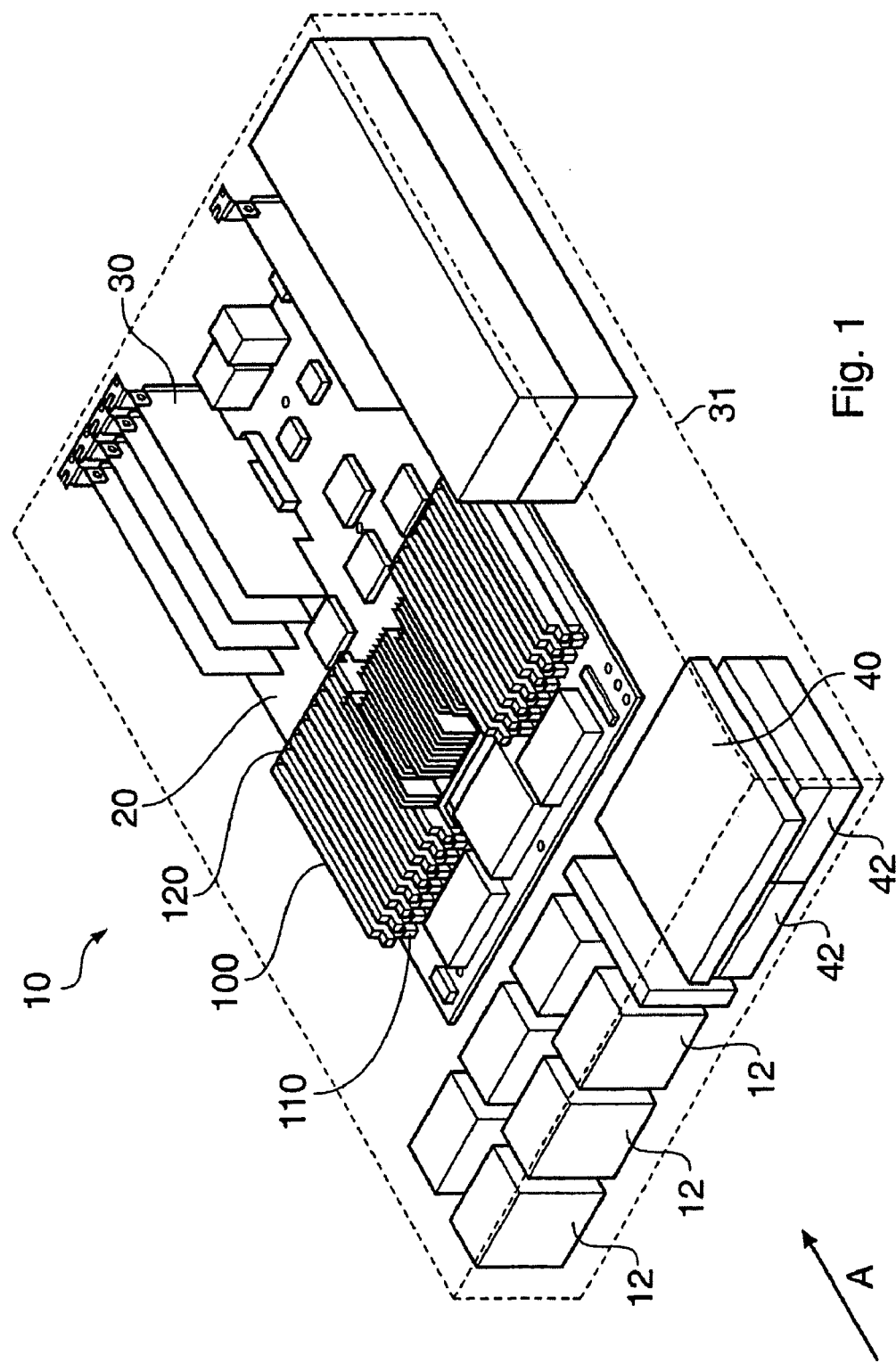
FIG. 1 illustrates an example of a computer system including an array of memory modules.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DESCRIPTION OF THE PARTICULAR EMBODIMENTS

Embodiments and examples are described hereafter by way of example only in the following with reference to the accompanying drawings.

FIG. 1 illustrates an example of a computer system 10, which includes an array 100 of memory modules 120 such as Dual Inline memory Modules (DIMMs). The computer system 10 also includes a circuit board 20 upon which the array 100 is mounted. A number of further components 30 are also mounted on the circuit board 20. The circuit board 20 is provided within a housing. In FIG. 1, the housing is indicated generally by the dotted line 31, so as to avoid obscuring the view of the components housed therein.

A number of further components can also be provided within the housing. In this example, a number of hard disc drives 42 and a DVD drive 40 are provided. A number of fan units 12 are also provided.

The array 100 includes a plurality of memory modules 120. In this example, each memory module 120 includes a board which is vertically mounted in a socket 110, which is itself mounted on the circuit board 20. Each board can include contacts for engaging with corresponding contacts of the socket 110. Each board can have a number of memory components mounted thereon. The memory components may, for example, comprise solid state memory such as double data rate (DDR) memory. The memory components can be mounted on one or both sides of each board.

Figure 2:
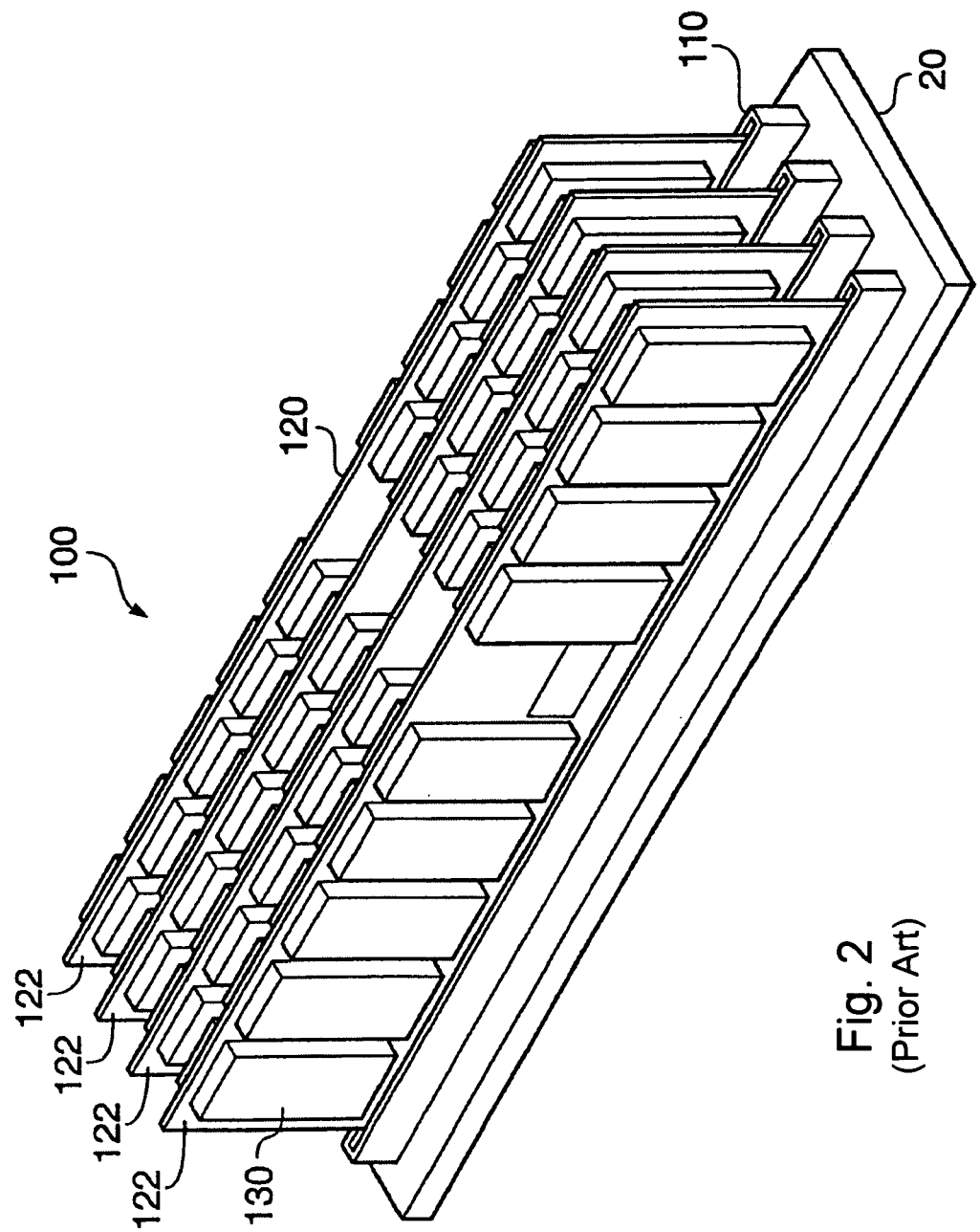
FIG. 2 illustrates an example array of memory modules.

FIG. 2 shows an example of a memory array 100 in more detail. The memory array 100 in this example includes four memory modules 120. Each memory module 120 includes a board 122, which is vertically mounted in a socket 110. The socket 110 is mounted on a circuit board 20. The socket 110 is not essential. In this example, each board 122 has nine memory components 130 mounted on each side thereof making a total of eighteen memory components 130 per board 122.

It is apparent from FIG. 2 that in the array 100, the memory components 130 are densely spaced. Accordingly, a large number of memory components 130 are located in close proximity to each other and thereby constitute a significant source of heat. Furthermore, since the memory components 130 are densely spaced, the dissipation of heat from the array 100 is hindered. For example, any flow of cooling air which is provided to carry heat away from the array 100 can only gain access to the memory components 130 which are positioned towards the centre of the array 100 by flowing in between two adjacent boards 122. Since the space between adjacent boards 122 may be narrow (for example less than 1 millimetre), no substantial flow of air between adjacent boards 122 can occur.

Examples of heatsink suitable for facilitating cooling of memory components 130 in an array 100 such as that described in relation to FIGS. 1 and 2 are described below.

Figure 3:
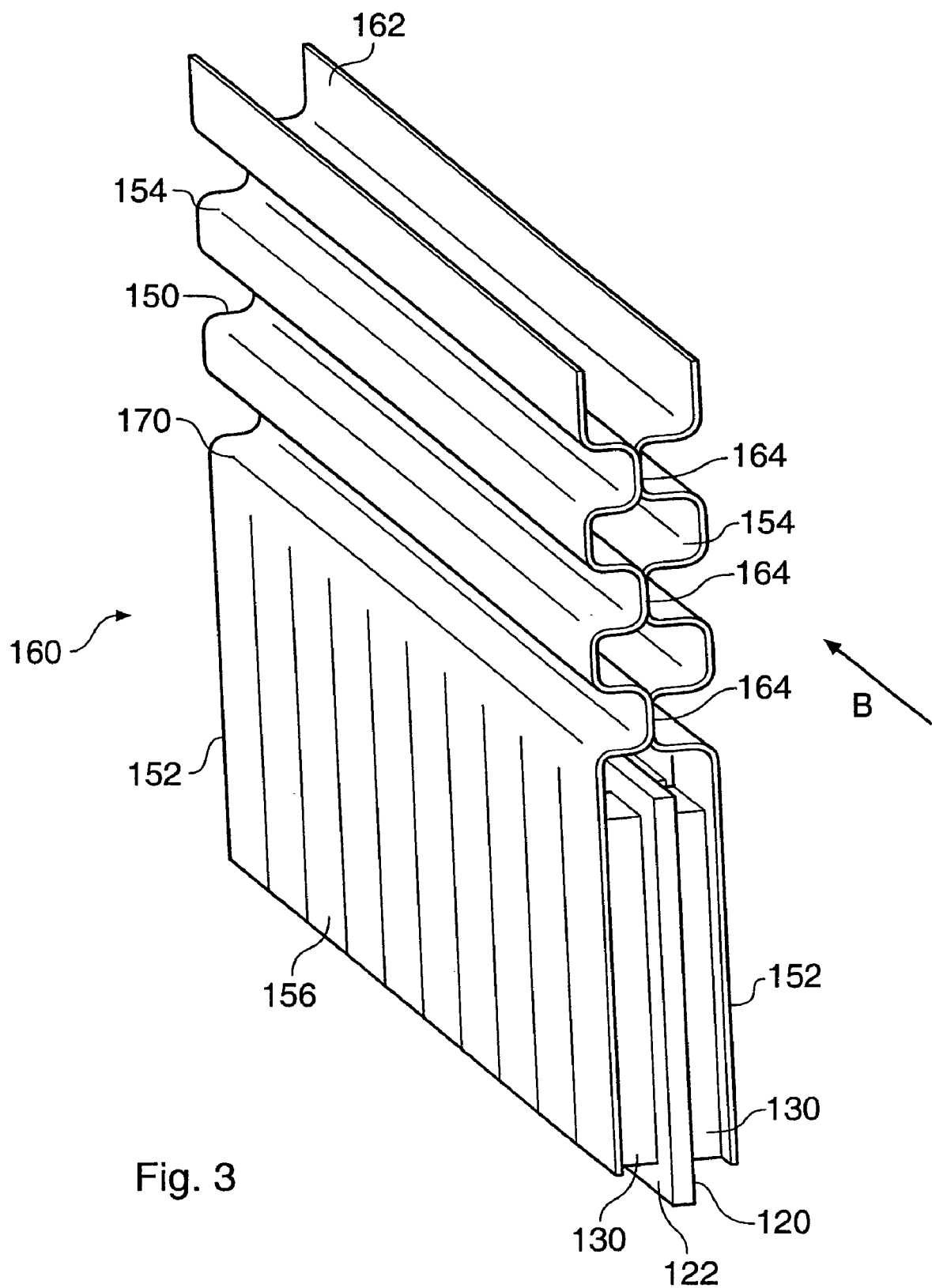
FIG. 3 illustrates an example of a memory module and heatsink assembly.

FIG. 3 shows an example of a heatsink and memory module assembly 160. The assembly includes a memory module 120 having a heatsink 170 mounted thereon. In this example, the memory module 120 includes a board 122, which has a plurality of memory components 130 mounted on a either side thereof. The board 122 can include contacts for connecting with corresponding contacts in a socket such as the socket 110 shown in FIGS. 1 and 2.

The heatsink in this example includes a pair of mutually opposing contact portions 152, which engage with opposite outer surfaces of the memory module 120. In particular, the contact portions 152 engage with the surfaces of the memory components 130. This allows heat produced by the memory components 130 to be transferred directly to the contact portions 152.

The heatsink 170 also includes formations 150 for emitting heat. The formations 150 in this example are integrally formed with the contact portions 152 and are therefore in thermal communication with the contact portions. In other examples the formations 150 can be formed separately and attached to the contact portions 152 in thermal contact therewith. In each case, the thermal contact between the formations 150 and the contact portions 152 allows heat acquired by the contact portions from the memory module 120 to migrate into the formations 150. Heat that has migrated into the formations 150 can then be emitted from the formations 150 as thermal radiation and can thereby be carried away from the memory module 120. In some examples, and as will be described below, a flow of cooling air can be provided across the formations 150 to facilitate the dissipation of heat therefrom.

In this example, the contact portions 152 each include a plurality of fingers 156. Each finger engages with a respective memory component 130 of the memory module 120. In other examples, the contact portions 152 may include fingers, which contact with a respective plurality of memory components 130. In other examples, the contact plates 152 are not split into fingers.

In this example, the contact portions 152 form a pair of jaws which are biased towards a closed position to engage with opposite outer surfaces of the memory module 120. Accordingly, when the heatsink 170 is mounted on the memory module 120, the contact portions 152 urge against the opposite outer surfaces of the memory module 120. This has the effect of improving the thermal contact between the contact portions 152 and the surfaces of the memory module 120. This also has the effect of the facilitating the mounting of the heatsink 170 on the memory module 120 and of preventing dislodgement of the heatsink 170 once it is mounted. Alternatively, or in addition to the biasing of the contact portions 152, a thermally conductive adhesive can be provided at the interface between the contact portions 152 and the opposite surfaces of the memory module 120. This would provide additional strength to the mounting of the heatsink 170 and also to improve thermal contact between the contact portions 152 and the memory module 120.

The formations 150 in this example include two thin pieces of thermally conductive material 154, which are each folded in a number of places so as to increase their surface area without significantly increasing the overall physical dimensions of the formations 150. The two pieces of material 154 are joined together in a number of places 164 by, for example, welding or using a thermally conductive adhesive.

The thin cross section of the pieces of material 154 and of the contact portions 152 provide a number of advantages.

Firstly, the width of the heatsink and memory module assembly 160 is substantially the same as the width of the memory module 120 without the heatsink 170 mounted thereon. Thus the ability of the memory module 120 to be mounted adjacent other components (such as other memory modules 120 having similar heatsinks 170 mounted thereon) is not impeded. Accordingly, an array such as the array 100 shown in FIGS. 1 and 2 is readily modifiable by mounting a heatsink 170 such as that shown in FIG. 3 on each memory module 120, whereby heat dissipation from the array 100 is significantly enhanced. In this manner, memory modules in a memory array can be densely spaced without over-heating, thereby saving space on a circuit board and in a computer system, where space is usually at a premium.

Secondly, the thin cross section of the pieces of material 154 of the formations 150 present minimal resistance to the flow of cooling air in a direction shown generally in FIG. 3 by the arrow labelled B. When the heatsink and memory module assembly 160 is mounted in a computer system, a fan of the computer system can be aligned to direct a flow of cooling air over the heatsink 150 in a direction substantially parallel to the direction shown by the arrow labelled B, thereby maximising the efficiency of the cooling provided by the heatsink 150.

Typical construction materials for the heatsink 170 include beryllium, copper or graphite. Beryllium copper is a springy metal and is therefore suitable for biased contact portions 152 as described above. Graphite has a high thermal conductivity and is therefore particularly suited for drawing heat away from the memory module and dissipating it.

Figure 4:
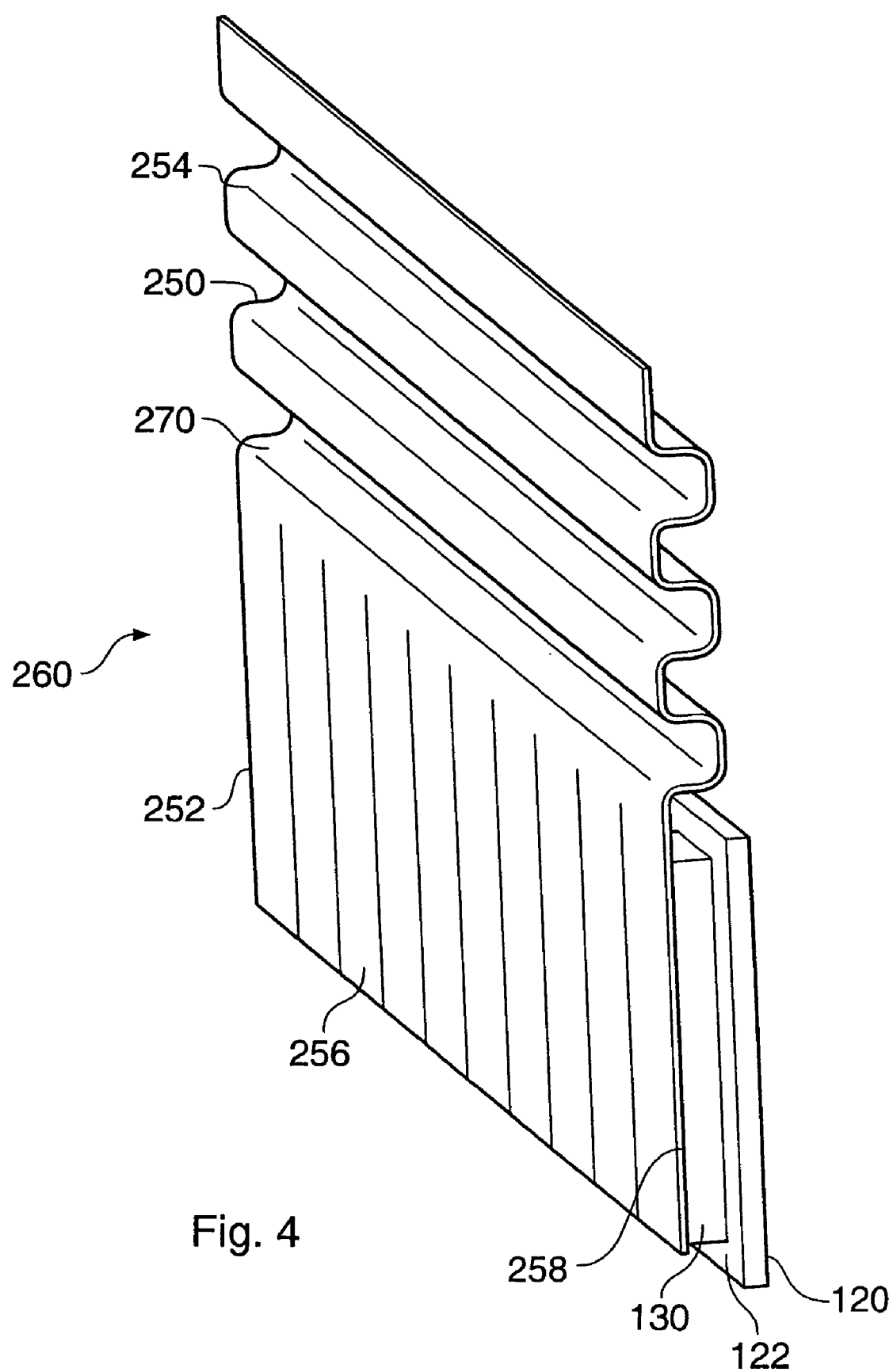
FIG. 4 illustrates another example of a memory module and heatsink assembly.

FIG. 4 shows another example of a heatsink and memory module assembly 260. The memory module 120 in this example only has memory components mounted on one side of the board 122. The heatsink includes a single contact portion 252, which as described above has a number of finger 256. The heatsink also includes formations 250 for emitting heat. The formations 250 are formed from a this piece of material 254 such as Beryllium copper or graphite as described above. The thin piece of material 254 can be formed integrally with, or attached to the contact portion 252. The contact portion can be mounted on the heatsink by, for example, providing a thermally conductive adhesive between the contact portion 252 and the memory module 120 (for example in the region indicated by the numeral 258 in FIG. 4). This would also provide a good thermal contact between the contact portion 252 and the memory module 120. Alternatively, or in addition, clips or other fixings could be provided for mounting the heatsink 270.

Heatsinks such as that shown in FIG. 4 may also be used in conjunction with memory modules having boards with memory components mounted on both sides (such as is shown in FIG. 2).

Other example configurations for formations 150 are envisaged. For example, the formations may include one or more fins. The fins may be folded in a manner analogous to the folds of the thin pieces of material 154 shown in FIG. 3. The fins may have a number of different profiles, for example sinusoidal or U-shaped. The fins of heatsinks which are mounted on neighbouring memory modules can be arranged to alternate out of phase (for example 180 out phase), or they can be chosen to have a different pitch. This can allow the spacing between the fins to be selected according to system requirements.

The heatsinks described in the examples given above provide a number of further advantages. Since the temperature of the memory modules upon which the heatsinks are mounted is reduced due to the enhanced cooling effect, this can allow memory modules to be used in environments having a high ambient temperature and/or low ambient air pressure (for example at raised altitudes). Furthermore, the increased cooling effect may allow reduced specification fans to be provided in a computer system (since a weaker flow of cooling air can suffice), whereby the overall cost of the computer system is reduced. Furthermore, different configurations of memory modules can be included in a memory array without significantly effecting the cooling of those memory modules. This is because when heatsinks such as those described above are used, the majority of cooling power provided for memory modules is provided by the heatsinks. This being the case, the flow of cooling air over the heatsinks would not be significantly affected by differing dimensions of the memory modules upon which they are mounted.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A heatsink for a memory module, the heatsink comprising:
   a pair of mutually opposing, substantially planar contact portions for forming a thermal contact with the memory module and for mounting the heatsink on the memory module; and
   a pair of mutually opposing formations for emitting heat, each of the formations for emitting heat being in thermal communication with at least one of the contact portions and comprising two or more folds, the formations being coupled with one another at two or more junctions, at least one of the junctions being between two of the folds.

2. The heatsink of claim 1, wherein the mutually opposing contact portions form a pair of jaws biased toward a closed position, for engaging with two opposite outer surfaces of the memory module for mounting the heatsink on the memory module.

3. The heatsink of claim 2, wherein the mutually opposing contact portions are formed from springy metal.

4. The heatsink of claim 1, dimensioned to occupy substantially a same width as a memory module on which it is mountable.

5. The heatsink of claim 1, wherein at least one of the contact portions comprises a plurality of contact fingers, each finger being suitable for forming thermal contact with a respective memory component of the memory module.

6. The heatsink of claim 1, wherein each of the contact portions is integrally formed with a respective formation for emitting heat.

7. The heatsink of claim 1, comprising sheet metal.

8. The heatsink of claim 1, comprising at least one of beryllium copper alloy, and graphite.

9. The heatsink of claim 1, wherein formations are coupled such that each of at least one pair of mutually opposing folds in the formations defines a passageway between adjacent junctions of the opposing formations, the passageway being configured to allow airflow to pass through the passageway over the length of the formations.

10. The heatsink of claim 9, wherein the passageway is a tubular passageway.

11. The heatsink of claim 10, wherein the formations comprise sheet metal, wherein the junctions of the contact portions comprise welded joints.

12. An assembly comprising a memory module and a heatsink, the heatsink being mounted on the memory module and comprising:
   a pair of mutually opposing, substantially planar contact portions forming a thermal contact with the memory module; and
   a pair of mutually opposing formations for emitting heat, each of the formations for emitting heat being in thermal communication with at least one of the contact portions and comprising two or more folds, the formations being coupled with one another at two or more junctions, at least one of the junctions being between two of the folds.

13. The assembly of claim 12, wherein the mutually opposing contact portions form a pair of jaws biased toward a closed position and engaged with two opposite outer surfaces of the memory module for mounting the heatsink on the memory module.

14. The assembly of claim 13, wherein the mutually opposing contact portions are formed from springy metal.

15. The assembly of claim 12, wherein the heatsink is mounted on the memory module using a thermally conductive adhesive located between at least one of the contact portions and the memory module.

16. The assembly of claim 12, dimensioned to occupy substantially a same width as a memory module on which it is mounted.

17. The assembly of claim 12, wherein at least one of the contact portions comprises a plurality of contact fingers, each finger being suitable for forming thermal contact with a respective memory component of the memory module.

18. The assembly of claim 12, wherein the formations for emitting heat are biased to allow passage of a flow of cooling air over the heatsink in one direction.

19. The assembly of claim 12, wherein the memory module comprises Double Data Rate (DDR) memory.

20. Apparatus comprising a circuit board and a memory module and heatsink assembly, wherein:
the memory module is mounted on the circuit board; and
the heatsink is mounted on the memory module and comprises:
a pair of mutually opposing, substantially planar contact portions forming a thermal contact with the memory module; and
a pair of mutually opposing formations for emitting heat, each of the formations for emitting heat being in thermal communication with at least one of the contact portions and comprising two or more folds, the formations being coupled with one another at two or more junctions, at least one of the junctions being between two of the folds.

21. The apparatus of claim 20, wherein the mutually opposing contact portions form a pair of jaws biased toward a closed position and engaged with two opposite outer surfaces of the memory module for mounting the heatsink on the memory module.

22. The apparatus of claim 21, wherein the mutually opposing contact portions are formed from springy metal.

23. The apparatus of claim 20, wherein the heatsink is mounted on the memory module using a thermally conductive adhesive located between at least one of the contact portions and the memory module.

24. The apparatus of claim 20, wherein the heatsink is dimensioned to occupy substantially a same width as the memory module on which it is mounted, for reducing space occupied by the memory module and heatsink assembly on the circuit board.

25. The apparatus of claim 20, wherein the formations for emitting heat are biased to allow passage of a flow of cooling air over the heatsink in one direction.

26. The apparatus of claim 20, comprising a socket mounted on the circuit board for receiving a plurality of memory module and heatsink assemblies side-by-side.

27. The apparatus of claim 20, wherein the memory module comprises Double Data Rate (DDR) memory.

28. A computer system comprising a circuit board and a memory module and heatsink assembly, wherein:
the memory module is mounted on the circuit board; and
the heatsink is mounted on the memory module and comprises:
a pair of mutually opposing, substantially planar contact portions forming a thermal contact with the memory module; and
a pair of mutually opposing formations for emitting heat, each of the formations for emitting heat being in thermal communication with at least one of the contact portions and comprising two or more folds, the formations being coupled with one another at two or more junctions, at least one of the junctions being between two of the folds.

29. The computer system of claim 28, wherein the mutually opposing contact portions form a pair of jaws biased toward a closed position and engaged with two opposite outer surfaces of the memory module for mounting the heatsink on the module.

30. The computer system of claim 28, wherein the mutually opposing contact portions are formed from springy metal.

31. The computer system of claim 28, wherein the heatsink is mounted on the memory module using a thermally conductive adhesive located between at least one of the contact portions and the memory module.

32. The computer system of claim 28, wherein the heatsink is dimensioned to occupy substantially a same width as the memory module on which it is mounted, for reducing space occupied by the memory module and heatsink assembly on the circuit board.

33. The computer system of claim 28, wherein the formations for emitting heat are biased to allow passage of a flow of cooling air over the heatsink in one direction.

34. The computer system of claim 33, comprising a fan positioned to direct a flow of cooling air over the formations for emitting heat in said one direction.

35. The computer system of claim 28, comprising a socket mounted on the circuit board for receiving a plurality of memory module and heatsink assemblies side-by-side.

36. The computer system of claim 28, wherein the memory module comprises Double Data Rate (DDR) memory.

37. A method for cooling a memory module, the method comprising providing heatsink comprising:
a pair of mutually opposing, substantially planar contact portions for forming a thermal contact with the memory module and for mounting the heatsink on the memory module; and
a pair of mutually opposing formations for emitting heat, each of the formations for emitting heat being in thermal communication with the contact portions; and
mounting the heatsink on the memory module and comprising two or more folds, the formations being coupled with one another at two or more junctions, at least one of the junctions being between two of the folds.

* * * * *